United States Patent
Lanzerotti et al.

(10) Patent No.: US 7,491,614 B2
(45) Date of Patent: Feb. 17, 2009

(54) METHODS FOR FORMING CHANNEL STOP FOR DEEP TRENCH ISOLATION PRIOR TO DEEP TRENCH ETCH

(75) Inventors: Louis D. Lanzerotti, Burlington, VT (US); Stephen A. St Onge, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 10/905,627

(22) Filed: Jan. 13, 2005

(65) Prior Publication Data
US 2006/0154440 A1    Jul. 13, 2006

(51) Int. Cl.
*H01L 21/336* (2006.01)
(52) U.S. Cl. .................. 438/296; 438/298; 438/424
(58) Field of Classification Search .......... 438/296, 438/298, 424
See application file for complete search history.

(56) References Cited

U.S. PATENT DOCUMENTS

| | | | | |
|---|---|---|---|---|
| 4,261,763 A | * | 4/1981 | Kumar et al. | 438/363 |
| 4,506,435 A | * | 3/1985 | Pliskin et al. | 438/296 |
| 4,532,696 A | * | 8/1985 | Iwai | 438/296 |
| 4,725,562 A | * | 2/1988 | El-Kareh et al. | 438/424 |
| 5,445,989 A | | 8/1995 | Lur et al. | |
| 5,849,621 A | * | 12/1998 | Gardner et al. | 438/279 |
| 5,956,599 A | * | 9/1999 | Kim | 438/444 |
| 5,960,298 A | | 9/1999 | Kim | |
| 6,017,801 A | * | 1/2000 | Youn | 438/296 |
| 6,074,904 A | * | 6/2000 | Spikes et al. | 438/223 |
| 6,144,086 A | * | 11/2000 | Brown et al. | 257/510 |
| 6,472,301 B1 | * | 10/2002 | Lin et al. | 438/524 |
| 6,586,804 B2 | * | 7/2003 | Choi et al. | 257/374 |
| 6,930,010 B1 | * | 8/2005 | Coppock et al. | 438/348 |
| 6,979,628 B2 | * | 12/2005 | Kim et al. | 438/427 |
| 7,098,102 B2 | * | 8/2006 | Lee et al. | 438/243 |
| 2003/0119245 A1 | | 6/2003 | Iwamatsu et al. | |
| 2003/0134480 A1 | | 7/2003 | Lee | |
| 2004/0014271 A1 | | 1/2004 | Cantell et al. | |
| 2006/0154440 A1 | * | 7/2006 | Lanzerotti et al. | 438/433 |

FOREIGN PATENT DOCUMENTS

JP          5283520 A       10/1993

* cited by examiner

*Primary Examiner*—Zandra Smith
*Assistant Examiner*—Khanh B Duong
(74) *Attorney, Agent, or Firm*—Anthony Canale; Hoffman Warnick LLC

(57) ABSTRACT

Methods of manufacturing a semiconductor structure are disclosed including a deep trench isolation in which a channel stop is formed in the form of an embedded impurity region in the substrate prior to the deep trench etch and formation of transistor devices (FEOL processing) on the substrate. In this fashion, the FEOL processing thermal cycles can activate the impurity region. The deep trench isolations are then formed after FEOL processing. The method achieves the reduced cost of forming deep trench isolations after FEOL processing, and allows the practice of sharing of a collector level between devices to continue.

14 Claims, 5 Drawing Sheets

METHODS FOR FORMING CHANNEL STOP FOR DEEP TRENCH ISOLATION PRIOR TO DEEP TRENCH ETCH

BACKGROUND OF THE INVENTION

1. Technical Field

The present invention relates generally to semiconductor device fabrication, and more particularly, to methods of manufacturing a semiconductor structure including a deep trench isolation in which the channel stop is formed prior to deep trench etch.

2. Related Art

In semiconductor devices, a number of transistors are generated in very close proximity to one another and isolated from one another by insulating deep trenches. For example, NPN transistor devices are typically formed with a collector that runs laterally through a sub-collector and then up to a contact level. The collectors terminate in an n-type substrate about 2 um deep. In order to isolate the different NPN devices on the wafer, a deep trench isolation in the form of an annulus is formed about the device down into the substrate to isolate the sub-collector of each NPN device from adjacent sub-collectors of other devices.

In order for a deep trench to fully isolate a device, it must include a channel stop at a lower end thereof within the substrate. In particular, if a deep trench is formed in, for example, an N+ subcollector, it extends into a P− substrate thereunder. In this situation, a deep trench isolation may invert, i.e., attract electrons, such that current can leak around the bottom of the deep trench isolation, resulting in current flowing between adjacent sub-collectors. To prevent inversion, deep trench isolations are typically formed with a channel stop that includes a dopant type that matches the substrate to prevent the deep trench isolation from inverting. In the above example, the dopant type would be p-type (e.g., boron) to match the substrate.

One issue relative to formation of deep trench isolations is when to form them during the fabrication process. Conventionally, deep trench isolations are formed in a substrate and then covered during transistor device fabrication. For example, in conventional processing, the following steps are completed prior to device fabrication: etching of a deep trench, forming a channel stop in the bottom of the deep trench, and finally filling of the deep trench with a dielectric. Formation of a channel stop is completed after the deep trench is etched, for example, by using a p-type (e.g., boron) implant into the bottom of the deep trench. This process is advantageous because as processing proceeds through front-end-of-line (FEOL) fabrication, i.e., device formation and metallization, the implant is exposed to a number of thermal cycles that activate the channel stop. The annealing allows the sharing of collector level between the devices (e.g., SiGE NPNs) because the collectors of adjacent devices are isolated from each other by the deep trench isolation. Without the channel stop, the bottom of the deep trench isolation is inverted and the collectors are electrically tied together.

In more advanced processing, however, it has been found advantageous from a cost perspective to generate deep trench isolations at the end of FEOL fabrication, i.e., after device formation and metallization. This latter situation, however, does not provide the thermal cycles required to activate the dopant of the channel stop for the deep trench isolations. Accordingly, a conventional channel stop cannot be used with the low cost deep trench isolation processing. As a result, shared deep trench isolations cannot be used because of inversion shorts. If a conventional channel stop is to be used, it would require device-to-device spacing that is vastly enlarged because a P-well must be inserted between the deep trench isolations of each device to create the isolation. This situation is untenable. In addition, for improved transistor packing density, it remains advantageous to have one large subcollector shape with multiple devices inside a big shape. This structure is only effective if shared deep trench isolations can be used.

In view of the foregoing, there is a need in the art for a way to form a deep trench isolation at the end of FEOL processing.

SUMMARY OF THE INVENTION

The invention includes methods of manufacturing a semiconductor structure including a deep trench isolation in which a channel stop is formed in the form of an embedded impurity region in the substrate prior to deep trench etch and formation of transistor devices (FEOL processing) on the substrate. In this fashion, the FEOL processing thermal cycles can activate the impurity region. The deep trench isolations are then formed after FEOL processing. The method achieves the reduced cost of forming deep trench isolations after FEOL processing, and allows the practice of sharing of a collector level between devices to continue.

A first aspect of the invention is directed to a method of manufacturing a semiconductor structure, the method comprising the steps of: providing a substrate; forming a masking layer having an opening on the substrate; implanting an impurity through the opening to form an impurity region in the substrate; and after the implanting step, forming a deep trench in the substrate substantially aligned to the impurity region, wherein a portion of the impurity region is located adjacent to a bottom surface of the deep trench.

A second aspect of the invention relates to a method of forming a deep trench in a semiconductor structure, the method comprising the steps of: forming an embedded impurity region in a substrate, the impurity region including a channel stop dopant appropriate for the substrate; forming a transistor device on the substrate; and after the transistor device forming step, forming a deep trench in the substrate substantially aligned to the impurity region, wherein a portion of the impurity region is located adjacent to a bottom surface of the deep trench so as to form a channel stop for the deep trench.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
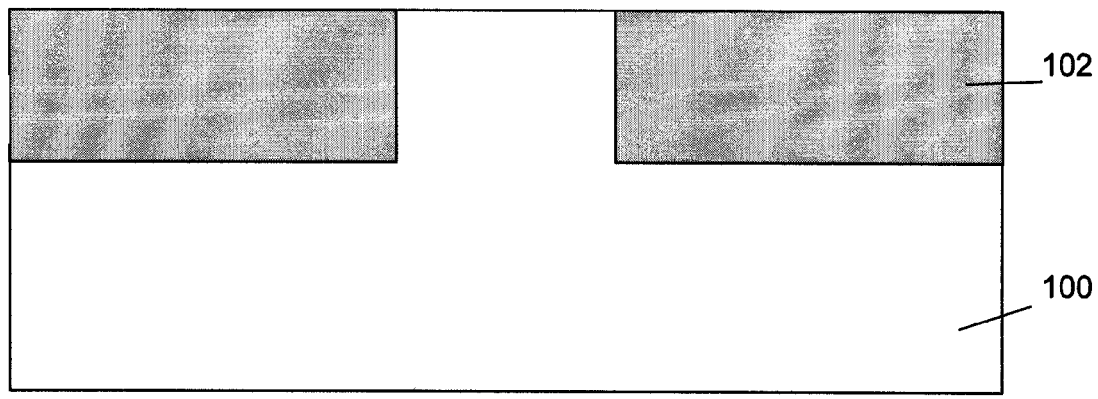
FIGS. 1-3 and 5-8 show a method of manufacturing a semiconductor structure according to the invention.

With reference to the accompanying drawings, FIG. 1 shows a first step of the method of manufacturing a semiconductor structure according to the invention. As shown in FIG. 1, the first step includes providing a substrate 100, which may include one or more shallow trench isolations (STI) 102 formed therein. Substrate 100 may be doped with any conventional dopant to form a p-type or n-type substrate, depending on the devices to be formed.

Figure 2:
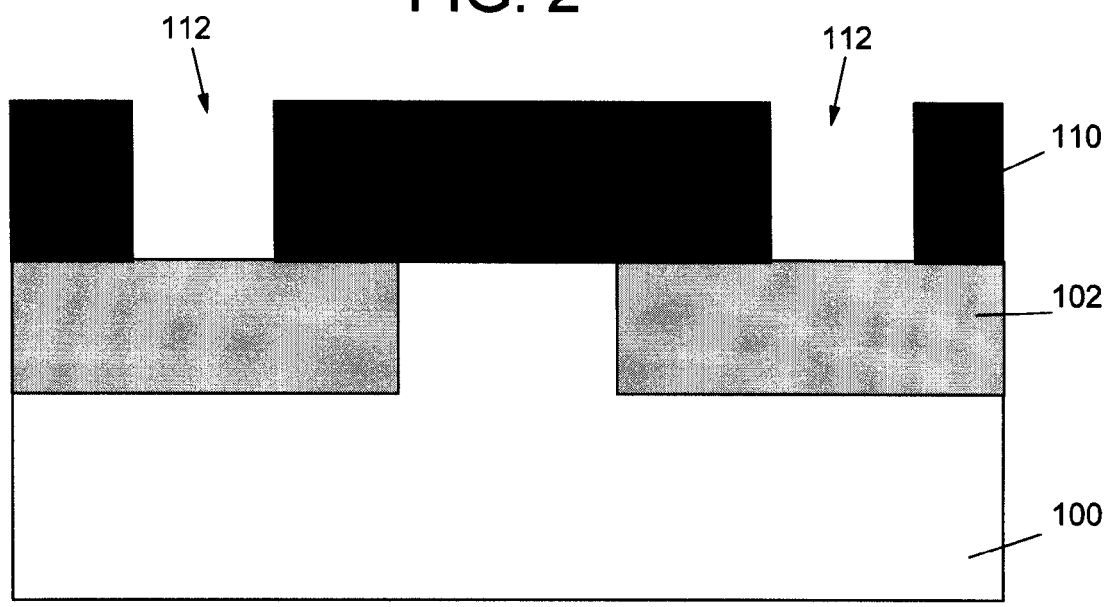

Turning to FIG. 2, a next step includes forming a masking layer 110 having an opening 112 on substrate 100. Masking layer 110 may be any now known or later developed masking material such as a photoresist. Opening 112 is opened in any conventional fashion, e.g., photolithography, patterning and etching.

Figure 3:
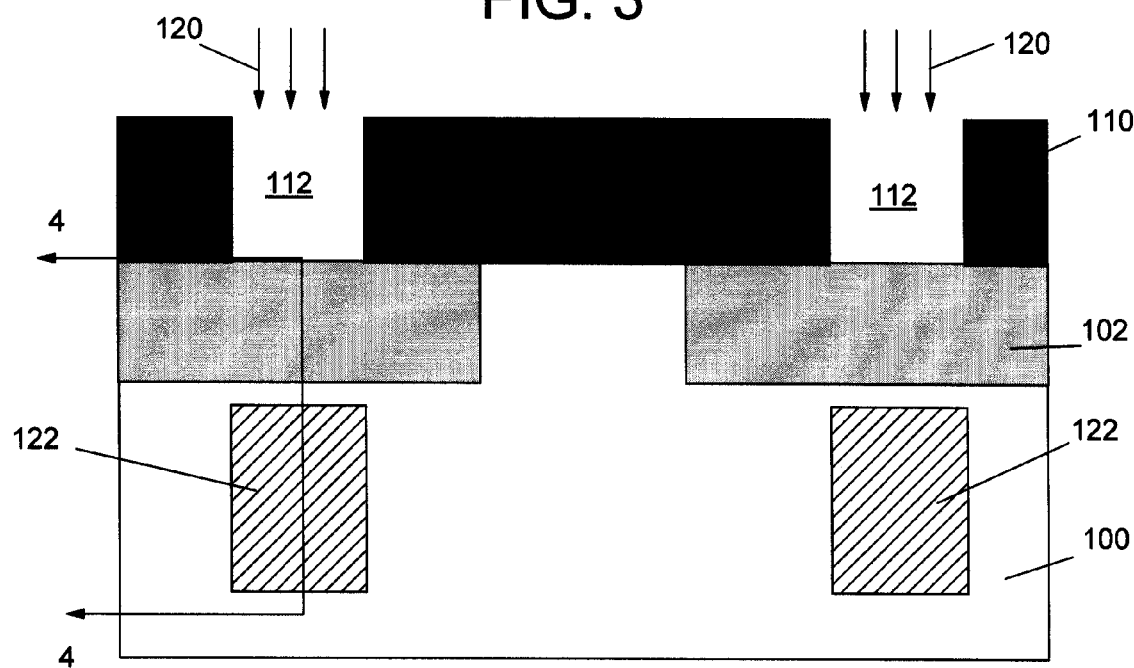
Figure 4:
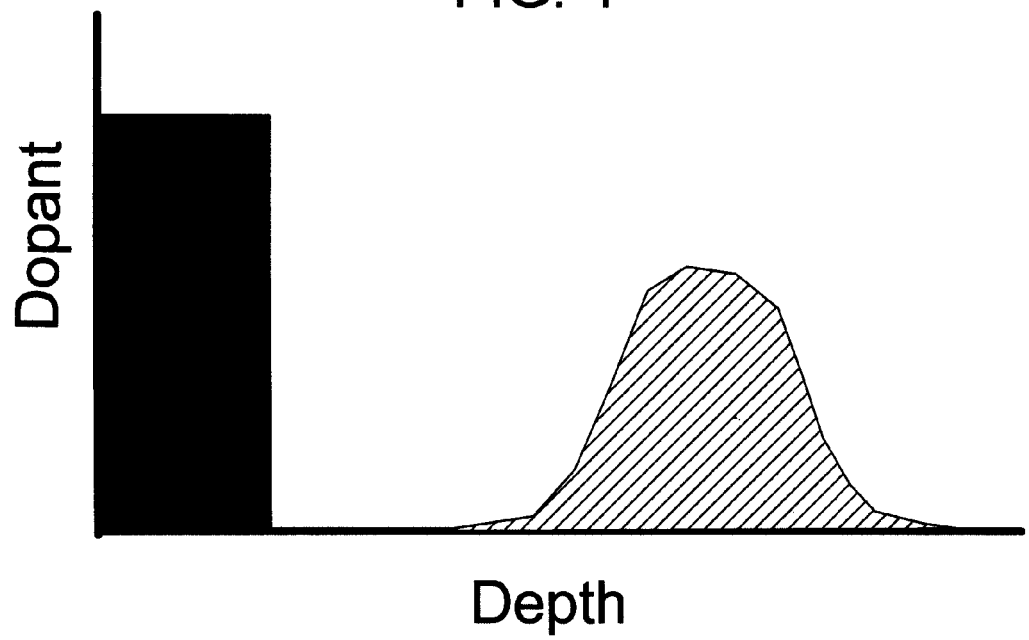
FIGS. 4 and 9 show dopant concentration versus depth graphs for the devices of FIG. 3 and FIG. 8, respectively.

Next, as shown in FIG. 3, an impurity is implanted 120 through opening 112 to form an (embedded) impurity region 122 in substrate 100. The impurity includes a dopant that is commensurate with a substrate dopant to form a channel stop for a deep trench isolation to be formed subsequently. That is, the impurity includes a dopant that will prevent attraction of electrons to a deep trench isolation formed adjacent thereto, and therefore, prevent inversion of the deep trench isolation, as will be described later. FIG. 4 shows a dopant concentration versus depth graph, i.e., a dopant profile, of impurity region 122 as taken along line 4-4 in FIG. 3. As shown in FIG. 4, impurity region 122 has a Gaussian profile into the depth of substrate 100. The implanting step uses an energy sufficient to have impurity region 122 extend beyond a bottom of the deep trench (when formed). The depth of the deep trench depends on the depth of the subcollector. In any event, the minimal energy used should be approximately 100 keV. Using this special masking and implanting steps, the dopant profile for impurity region 122 can be optimized for later formation into a channel stop, as will be described below.

In an alternative embodiment, the steps of forming masking layer 110 and opening 112 and implanting 120, may be provided as part of a step of implanting a well region (not shown) using the masking layer. For example, these steps may be carried out with the masking/opening and implanting of a P-well. In this case, the cost of an additional masking layer 110 would be eliminated. However, the ability to tailor the dopant profile would be lost.

Figure 5:
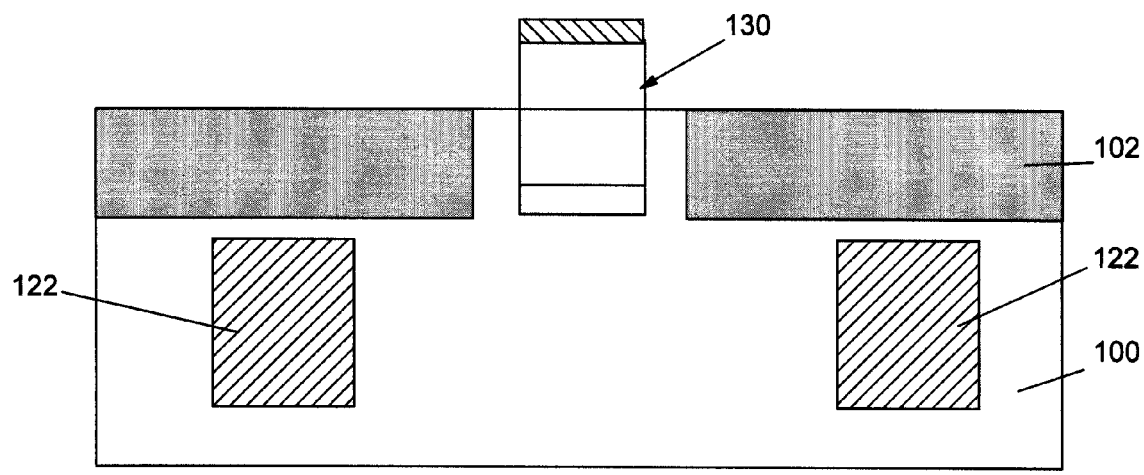

As shown in FIG. 5, a next step includes conducting typical front-end-of-line (FEOL) processing to form a transistor device 130. FEOL processing may include any now known or later developed processing up to and including metallization of transistor devices 130. For example, FEOL processing may include implanting wells into substrate 100, forming field effect transistors (FETs) 130, building a bipolar transistor, passive elements, and metalizing (forming silicide, etc.) FETs 130. In any event, FEOL processing includes a number of thermal cycles that act to anneal impurity region 122. The annealing may be provided as part of the normal processing, or an additional annealing step may be implemented especially for impurity region 122.

Figure 6:
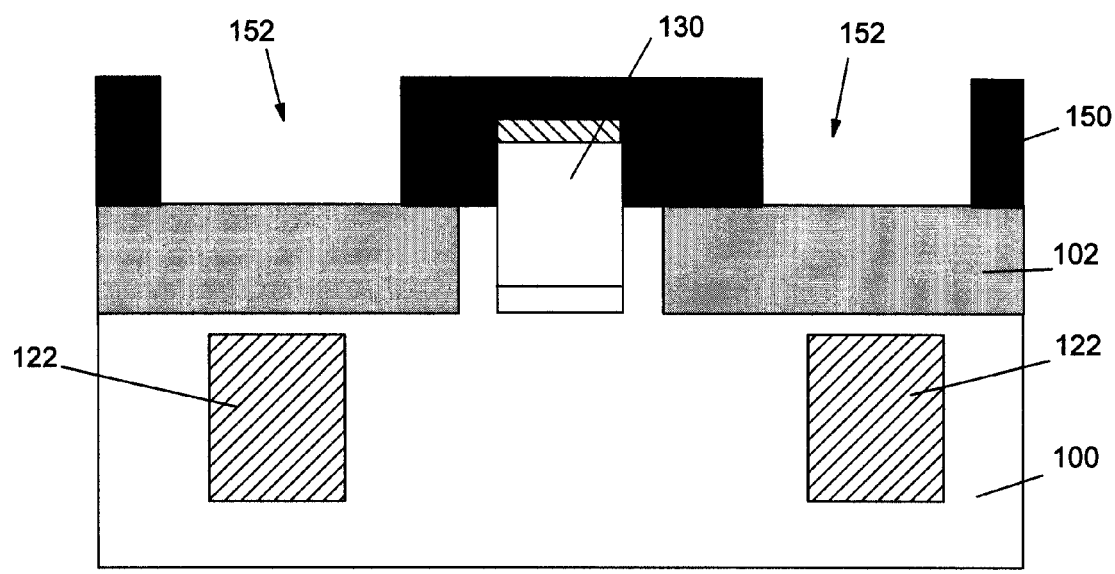
Figure 7:
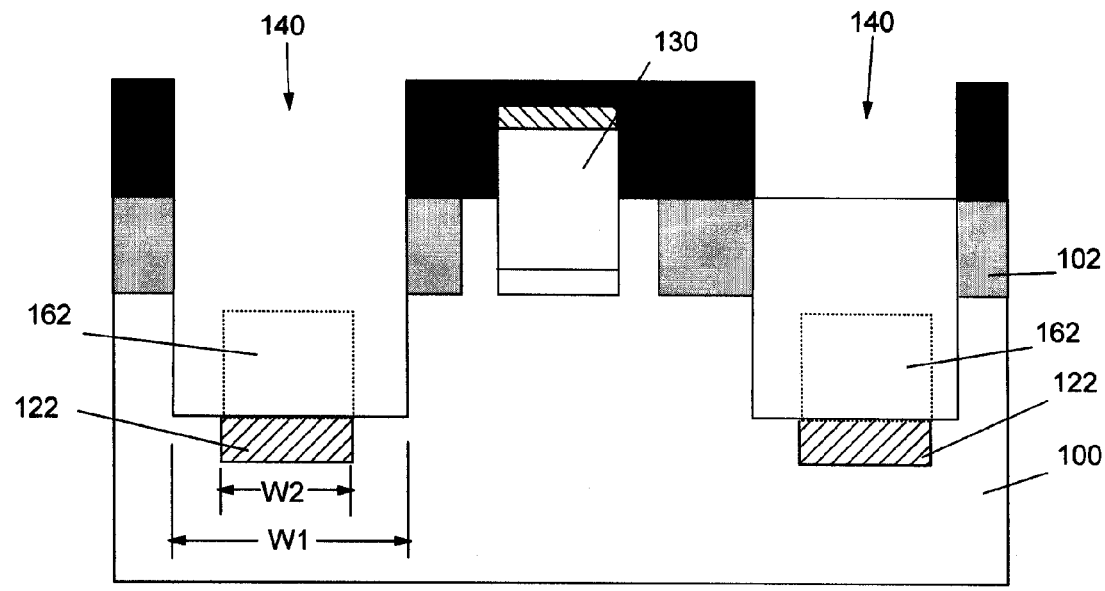
Figure 8:
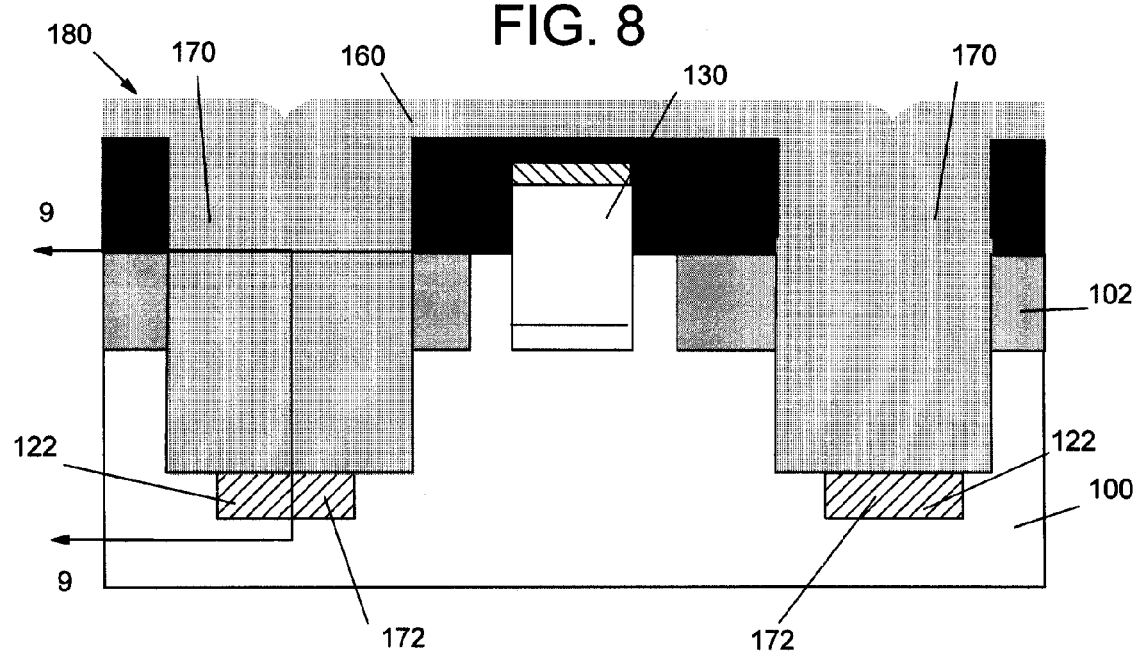

Referring to FIGS. 6-8, after the implanting step, a deep trench isolation 140 (FIG. 7) is formed next in substrate 100. This step includes, as shown in FIG. 6, forming a second masking layer 150 having an opening 152 on substrate 100, etching, as shown in FIG. 7, to form deep trench 140, and filling deep trench 140 with a dielectric 160, as shown in FIG. 8. The etching can be any now known or later developed etching process. As shown in FIG. 7, the etching removes a part 162 of impurity region 122, leaving a channel stop 172 for deep trench isolation 170. In addition, while each deep trench 140 is substantially aligned to an impurity region 122, each deep trench 140 is preferably formed such that it has a larger width W1 than impurity region 122 W2. Accordingly, a portion of impurity region 122 (i.e., channel stop 172) is located adjacent to a bottom surface of deep trench 140, but does not extend to the full width of deep trench 140, as is conventional. That is, at least a portion of each edge of channel stop 172 is spaced inwardly from an edge of deep trench 140. Dielectric 160 can be any now known or later developed material used for deep trench isolations such as boro-phospho-silicate glass (BPSG). Subsequent processing (not shown) may include customary polishing and back-end-of-line processing.

Figure 9:
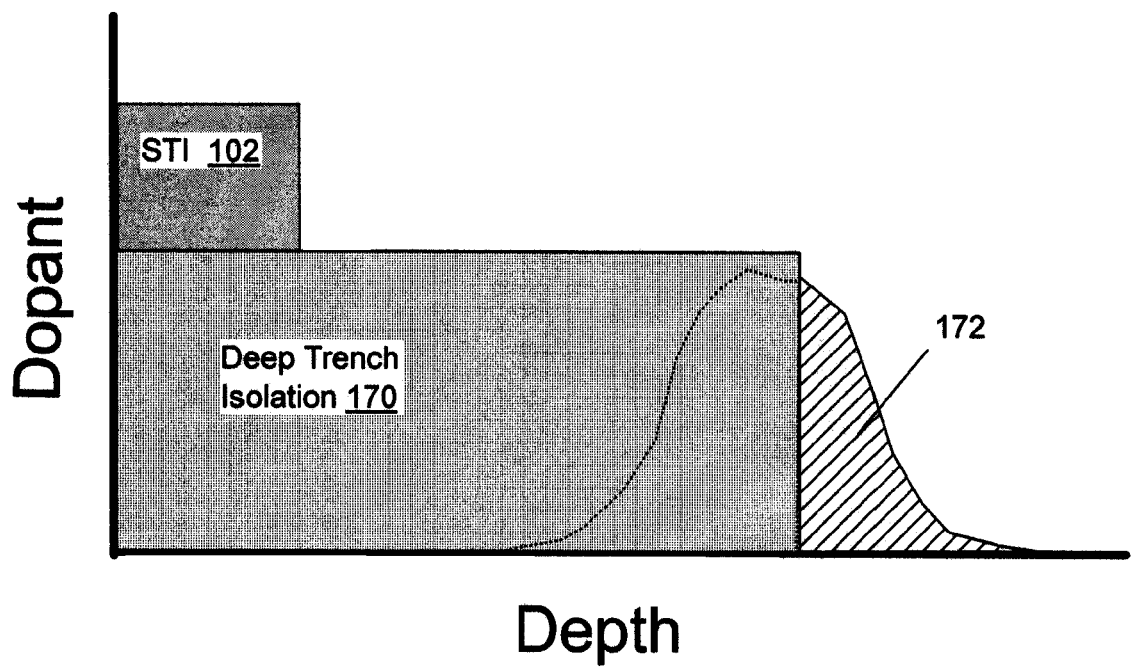

FIG. 9 illustrates a dopant concentration versus depth graph, i.e., a dopant profile, of deep trench isolation 170, impurity region 122 (channel stop) as taken along line 9-9 in FIG. 8. As shown in FIG. 9, channel stop 172 may have a half-Gaussian profile into the depth of substrate 100 (FIG. 8), depending on the depth of deep trench isolation 170.

Returning to FIG. 8, the invention also includes a semiconductor structure 180 including substrate 100, and deep trench isolation 170 including dielectric 160 positioned within deep trench 140, and channel stop 172. As described above, at least a portion of an edge of channel stop 172 is spaced inwardly from an edge of deep trench 140, as shown best in FIG. 7 by widths W1 and W2. As shown in FIG. 9, a dopant concentration of channel stop 172 (FIG. 8) decreases with increasing depth into substrate 100 (FIG. 8).

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of manufacturing a semiconductor structure, the method comprising the steps of:
   providing a substrate;
   forming a masking layer having an opening on the substrate;
   prior to deep trench etch and formation of transistor devices, implanting an impurity through the opening to form an impurity region in the substrate;
   after the implanting step, forming transistor devices on the substrate, wherein the transistor device formation includes:
   implanting a well in the substrate;
   forming a field effect transistor on the substrate; and
   metalizing the field effect transistor; and
   after the transistor device forming step, forming a deep trench isolation in the substrate substantially aligned to the impurity region, wherein the deep trench isolation forming includes forming a trench that has a larger width at a bottom than the impurity region;
   wherein a portion of the impurity region is located adjacent to a bottom surface of the deep trench isolation.

2. The method of claim 1, further comprising the step of annealing the impurity region.

3. The method of claim 1, wherein the impurity region forms a channel stop for the deep trench isolation.

4. The method of claim 1, wherein the impurity includes a dopant.

5. The method of claim 1, wherein the implanting step uses an energy no less than 100 keV.

6. The method of claim 1, further comprising the step of implanting a well region using the masking layer.

7. The method of claim 1, wherein the providing step and the masking layer forming step occur prior to the step of forming transistor devices on the substrate.

8. The method of claim 1, wherein the deep trench isolation forming step includes forming a masking layer having an opening on the substrate, etching to form a deep trench, wherein the etching step removes a part of the impurity region, and filling the deep trench with a dielectric.

9. A method of forming a deep trench isolation in a semiconductor structure, the method comprising the steps of:
prior to deep trench etch and formation of transistor devices, forming an embedded impurity region in a substrate, the impurity region including a channel stop dopant appropriate for the substrate;
after the embedded impurity region forming step, forming a transistor device on the substrate, wherein the transistor device formation includes:
implanting a well in the substrate;
forming a field effect transistor on the substrate; and
metalizing the field effect transistor; and
after the transistor device forming step, forming a deep trench isolation in the substrate substantially aligned to the impurity region, wherein the deep trench isolation forming includes forming a trench that has a larger width at a bottom than the impurity region;
wherein a portion of the impurity region is located adjacent to a bottom surface of the deep trench isolation so as to form a channel stop for the deep trench isolation.

10. The method of claim 9, wherein the embedded impurity region forming step includes:
forming a first masking layer having a first opening on the substrate; and
implanting an impurity through the first opening to form the embedded impurity region in the substrate.

11. The method of claim 10, further comprising the step of annealing the embedded impurity region during the transistor device forming step.

12. The method of claim 10, further comprising the step of implanting a well region using the first masking layer.

13. The method of claim 10, wherein the deep trench isolation forming step includes forming a second masking layer having a second opening on the substrate in substantially the same location as the first opening of the first masking layer, etching to form a deep trench, wherein the etching step removes a part of the embedded impurity region, and filling the deep trench with a dielectric.

14. The method of claim 10, wherein the implanting step uses an energy no less than 100 keV.

* * * * *